US011410021B2

(12) United States Patent
Manipatruni et al.

(10) Patent No.: US 11,410,021 B2
(45) Date of Patent: Aug. 9, 2022

(54) RECURRENT NEURON IMPLEMENTATION BASED ON MAGNETO-ELECTRIC SPIN ORBIT LOGIC

(71) Applicant: INTEL CORPORATION, Santa Clara, CA (US)

(72) Inventors: Sasikanth Manipatruni, Portland, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 771 days.

(21) Appl. No.: 16/175,238

(22) Filed: Oct. 30, 2018

(65) Prior Publication Data
US 2020/0134419 A1    Apr. 30, 2020

(51) Int. Cl.
| | | |
|---|---|---|
| G06N 3/04 | (2006.01) | |
| H01L 43/02 | (2006.01) | |
| H01L 43/12 | (2006.01) | |
| H01F 10/32 | (2006.01) | |
| H01F 41/32 | (2006.01) | |
| H03K 19/18 | (2006.01) | |
| H01L 27/22 | (2006.01) | |
| H01L 43/10 | (2006.01) | |

(52) U.S. Cl.
CPC ......... *G06N 3/0445* (2013.01); *H01F 10/329* (2013.01); *H01F 41/32* (2013.01); *H01L 27/22* (2013.01); *H01L 43/02* (2013.01); *H01L 43/12* (2013.01); *H03K 19/18* (2013.01); *H01L 43/10* (2013.01)

(58) Field of Classification Search
CPC ......... H01L 27/22; H01L 43/02; H01L 43/12; H01L 43/10; G06N 3/0445; H01F 10/329; H01F 41/32; H03K 19/18

USPC .......................................................... 706/30
See application file for complete search history.

(56) References Cited

U.S. PATENT DOCUMENTS 5,671,336 A * 9/1997 Yoshida ............... G06N 3/0635
                                                      706/30

OTHER PUBLICATIONS

Manipatruni et al ("Spin-Orbit Logic with Magnetoelectric Nodes: A Scalable Charge Mediated Nonvolatile Spintronic Logic" arXiv: 1512.05428 [cond-mat.mes-hall] published online on Dec. 17, 2015 and updated on Mar. 5, 2017, accessed at https://arxiv.org/abs/1512.05428 on Dec. 17, 2021 (Year: 2015).*

* cited by examiner

*Primary Examiner* — Jami Valentine Miller
(74) *Attorney, Agent, or Firm* — Schwabe, Williamson & Wyatt, P.C.

(57) ABSTRACT

Techniques are provided for implementing a recurrent neuron (RN) using magneto-electric spin orbit (MESO) logic. An RN implementing the techniques according to an embodiment includes a first MESO device to apply a threshold function to an input signal provided at a magnetization port of the MESO device, and scale the result by a first weighting factor supplied at an input port of the MESO device to generate an RN output signal. The RN further includes a second MESO device to receive the RN output signal at a magnetization port of the second MESO device and generate a scaled previous RN state value. The scaled previous state value is a scaled and time delayed version of the RN output signal based on a second weighting factor. The RN input signal is a summation of the scaled previous state value of the RN with weighted synaptic input signals provided to the RN.

24 Claims, 10 Drawing Sheets

MESO based RNN configurations
700b

One to One
750

One to Many
752

Many to One
754

RNN Node
200

Many to Many
756

Many to Many
758

800

RECURRENT NEURON IMPLEMENTATION BASED ON MAGNETO-ELECTRIC SPIN ORBIT LOGIC

BACKGROUND

Neural networks are becoming increasingly important and their use in many technological fields is growing rapidly. One type of neural network, referred to as a recurrent neural network (RNN), is a class of artificial neural network where connections between network nodes can form directed cycles or feedback loops. This feedback allows an RNN to exhibit dynamic temporal behavior. Unlike feedforward neural networks, RNNs can use their internal memory, provided through the feedback loops, to process arbitrary sequences of inputs. This makes them particularly suitable for tasks such as natural language processing, hand-writing recognition, and speech recognition, to name a few.

Figure 1:
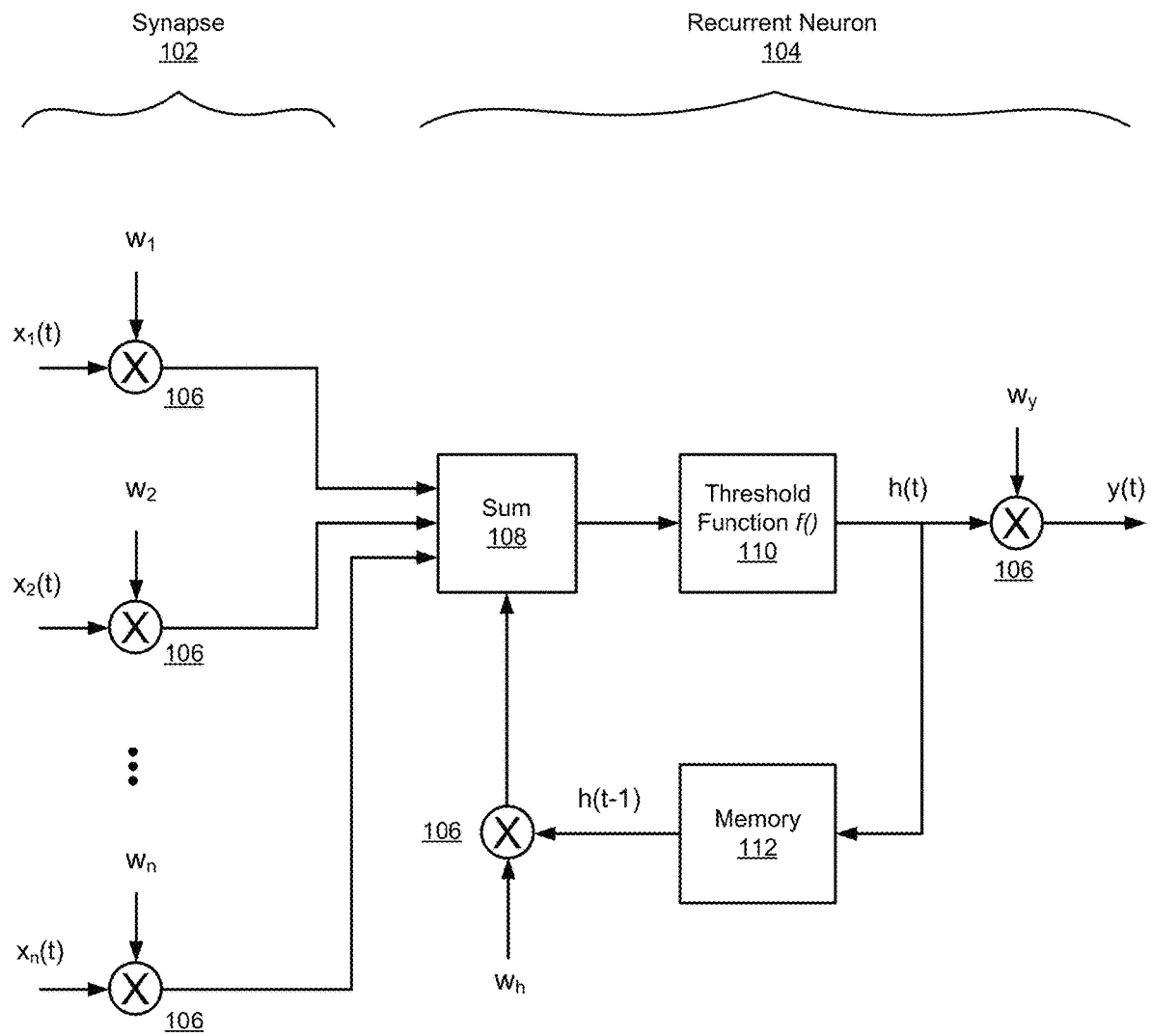
FIG. 1 is a block diagram of a recursive neural network (RNN) node, configured in accordance with certain embodiments of the present disclosure.

Although the following Detailed Description will proceed with reference being made to illustrative embodiments, many alternatives, modifications, and variations thereof will be apparent in light of this disclosure.

DETAILED DESCRIPTION

Techniques are provided for implementing a recurrent neuron (RN) using magneto-electric spin orbit (MESO) logic. RNs include an internal feedback loop which enables them to implement memory functionality that makes them particularly suitable for certain applications such as natural language processing, image/video captioning, sentiment classification, and translation, for example. The RNs may then be employed in a recursive neural network (RNN) which can implement additional external feedback loops.

The use of MESO logic based devices in RNs, as opposed to, for instance, complementary metal-oxide-semiconductor (CMOS) technology, provides advantages in that the RNs may generally be implemented with fewer components. Additionally, some embodiments disclosed herein enable the MESO based RNs to operate with switching times of less than 1 nanosecond and to consume energy on the order of 10 attojoules ($10^{-18}$ J), which is comparable to the switching energy of CMOS transistors. Further still, some embodiments allow for the RNs to propagate signals between components of the RN (e.g., between the inputs and the output of the RN) using electric charge currents rather than spin polarized currents, which typically limit the utility of other spin-based magnet switching techniques. As a result, the distance between the inputs and the output (and, thus, the number of inputs possible for a single RN and/or its associated size) is effectively unlimited within practical constraints, according to some embodiments.

The disclosed techniques can be implemented, for example, in a recurrent neural network on an integrated circuit (IC) or chip-set, although other embodiments will be apparent. In some such embodiments, the RN comprises two MESO devices coupled in a feedback loop configuration, as will be described in greater detail below, and operates on signals provided from a synapse component which, in some further such embodiments, comprises additional MESO devices.

As will be appreciated, the techniques described herein may allow for improved RNs and RNNs, compared to techniques that use primarily CMOS logic (e.g., transistors) or equivalents thereof. Thus, in accordance with an embodiment, a recurrent neuron implementing the techniques includes a first MESO device configured to apply a threshold function to an input signal of the recurrent neuron, wherein the input signal is supplied through a magnetization port of that MESO device. The first MESO device is also configured to scale the thresholded recurrent neuron input signal by a first weighting factor, wherein the first weighting factor is supplied through an input port of that MESO device to generate an output signal of the recurrent neuron at an output port of the MESO device. The RN further includes a second MESO device configured to receive the recurrent neuron output signal at a magnetization port of the second MESO device and to generate a scaled previous state value of the recurrent neuron at an output port of the second MESO device. The scaled previous state value is a scaled and time delayed version of the recurrent neuron output signal generated by the first MESO device. The scaling is based on a second weighting factor supplied through an input port of the second MESO device. The recurrent neuron input signal, as supplied to the first MESO device, is a summation of the scaled previous state value of the recurrent neuron with one or more weighted synaptic input signals provided to the RN, as will be described in greater detail below.

The disclosed techniques can be implemented on a broad range of platforms that may employ RNNs, including laptops, tablets, smart phones, workstations, video conferencing systems, gaming systems, smart home control systems, imaging systems, robotic systems, and other such systems that perform video processing applications, audio processing applications, language applications, entertainment applications, and robotic applications.

FIG. 1 is a block diagram of a recursive neural network (RNN) node 100, configured in accordance with certain embodiments of the present disclosure. The RNN node 100 is shown to include a synapse component 102 and a recurrent neuron component 104. The synapse component 102 is configured to apply weighting scale factors $w_i$ to one or more synaptic input signals $x_i(t)$ using multiplier circuits 106. In some embodiments, the synaptic input signals may originate at the outputs of other RNN nodes 100 of the recursive neural network, from data-providing sensors, or from any other suitable source.

The recurrent neuron component 104 is shown to include a summing circuit 108, a threshold function circuit 110, a memory circuit 112, and additional multiplier circuits 106. The recurrent neuron component 104 is configured to generate an output signal y(t) based on a sum of the weighted inputs provided from the synapse component, using a recurrence formula at each update time t. In some embodiments, the recurrence formula may be expressed as follows:

$$h(t) = f\left(w_h h(t-1) + \sum_{i=1}^{n} w_i x_i(t)\right) \quad (1)$$

$$y(t) = w_y h(t) \quad (2)$$

where h(t) is the current state of the neuron, and h(t−1) is the previous state of the neuron which is generated by memory circuit 112 and fed back to the summing circuit 108. In some embodiments, threshold function f( ) may be implemented as a hyperbolic tangent function tanh( ). Additional weighting scale factors $w_y$ and $w_h$ are applied by multiplier circuits 106 as shown in the figure and as indicated in the recurrence formula above.

The output signal y(t) may be routed as a synaptic input to another RNN node 100 of the recursive neural network, or may be used as an output of the network.

Figure 2:
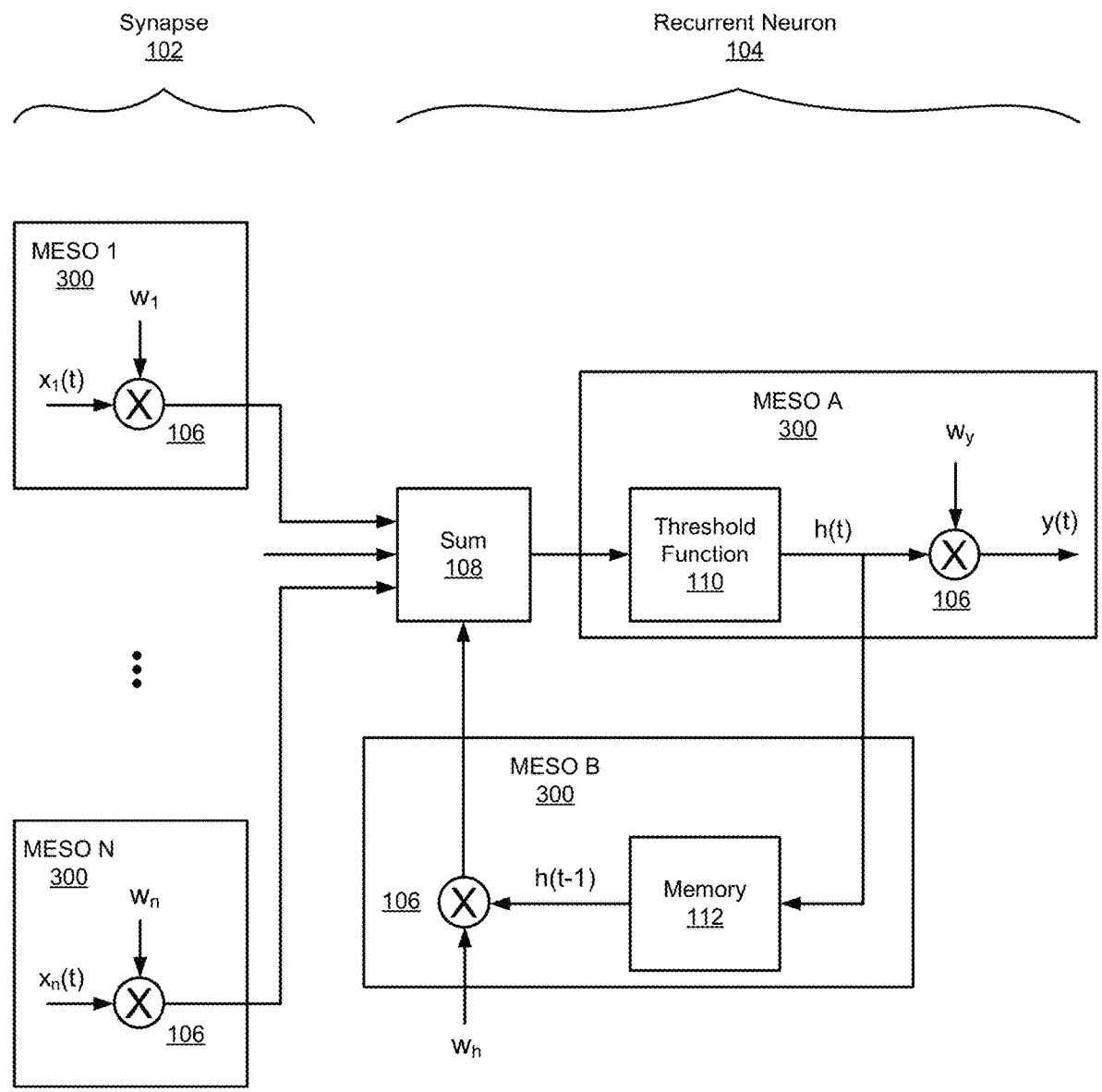
FIG. 2 is a top-level block diagram of a magneto-electric spin orbit (MESO) implementation of an RNN node, configured in accordance with certain embodiments of the present disclosure.

FIG. 2 is a top-level block diagram of a magneto-electric spin orbit (MESO) implementation 200 of an RNN node, configured in accordance with certain embodiments of the present disclosure. The RNN node 200 is shown to include a number of MESO devices 300, the operation of which will be described in greater detail below. The synapse component 102 employs N MESO devices 300 configured to apply the weighting scale factors $w_i$ to the N synaptic input signals $x_i(t)$. The weighted synaptic inputs (along with the weighted previous neuron state) are summed together at a current summing junction 108.

The recurrent neuron 104 is shown to include summing junction 108 and two additional MESO devices: MESO A and MESO B. The current summing junction 108 is configured to sum the weighted synaptic inputs $w_i x_i(t)$ along with the weighted previous neuron state $w_h h(t-1)$.

MESO device A is configured to perform the thresholding function 110 and the output signal scaling $w_y$. MESO device B is configured to perform the memory delay 112 to generate the previous neuron state and to perform the feedback scaling $w_h$.

Figure 3:
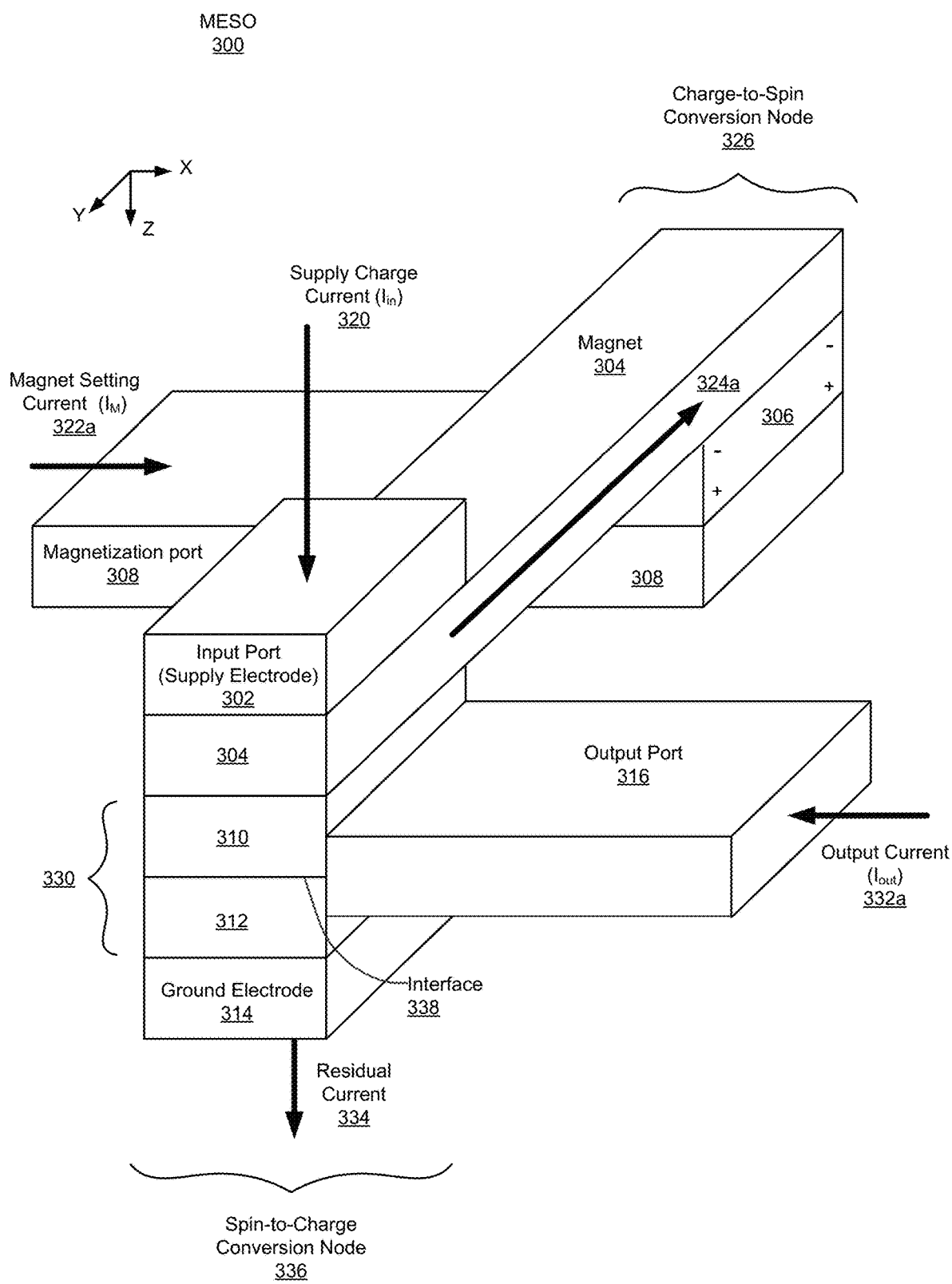
FIG. 3 is a detailed diagram of a MESO device, configured in accordance with certain embodiments of the present disclosure.
Figure 4:
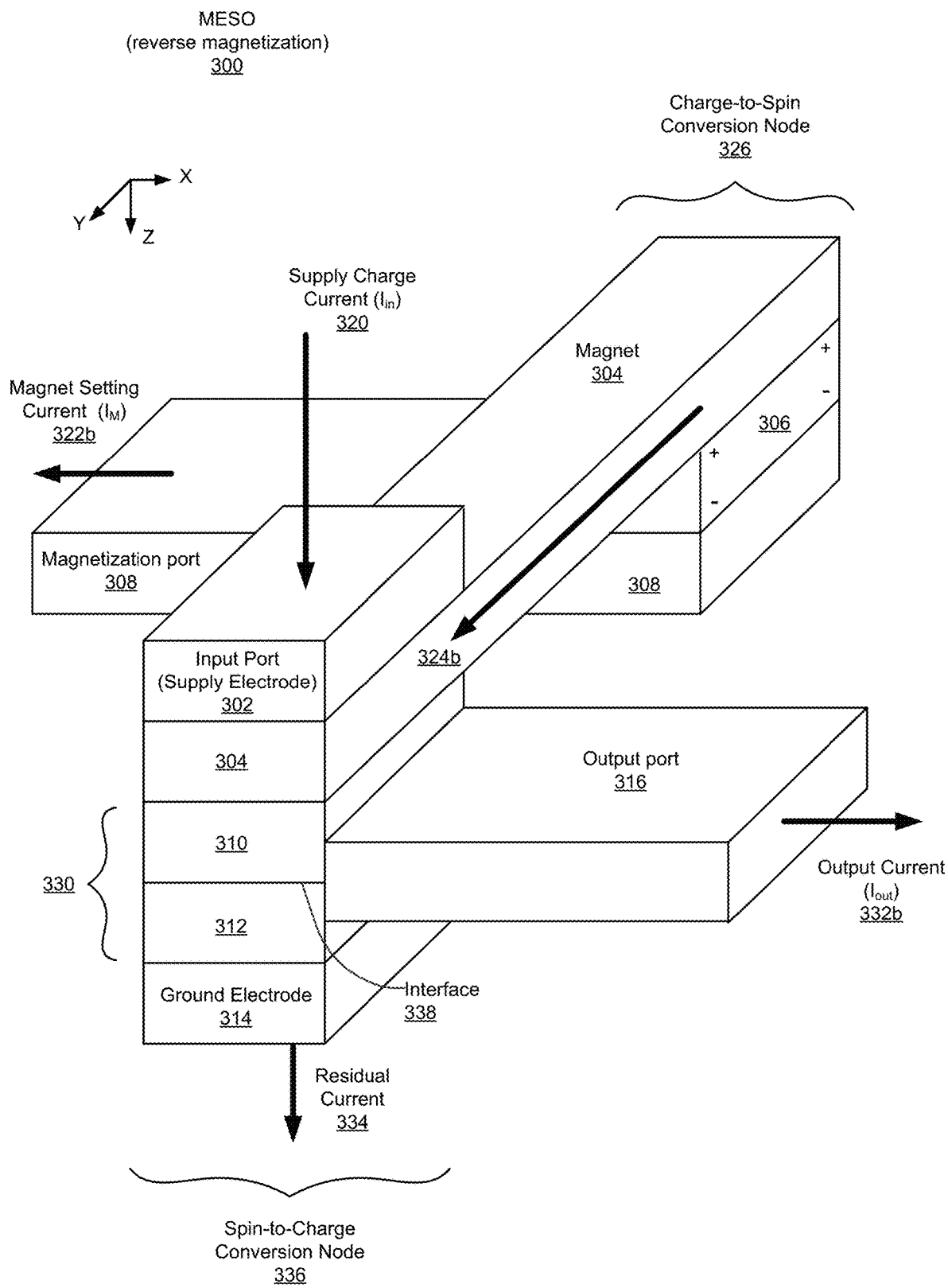
FIG. 4 is another detailed diagram of a MESO device, configured in accordance with certain embodiments of the present disclosure.

FIGS. 3 and 4 are detailed diagrams of a magneto-electric spin orbit (MESO) device 300, configured in accordance with certain embodiments of the present disclosure. FIG. 4 illustrates the MESO device in a reverse magnetization state relative to the MESO device illustrated in FIG. 3.

At a high level, the MESO device 300 is shown to include a magnet 304 configured to couple a charge-to-spin conversion node 326 to a spin-to-charge conversion node 336. The device is also shown to include three ports: a magnetization port 308, an input port (or supply electrode) 302, and an output port 316. Magnet 304 comprises a ferromagnetic material which retains the magnetization setting that is induced on it by the device, which is to say that it is nonvolatile.

The charge-to-spin conversion node 326 is configured to convert an electric charge current into spin (i.e., magnetization). It is configured as a capacitor with magnet 304 and magnetization port 308 serving as electrical plates separated by a dielectric material 306, which has both ferroelectric properties (e.g., can be electrically polarized with or without an applied electric field) and magnetic properties (e.g., may exhibit surface spin polarization which can be switched under the application of an external electric field).

The magnet setting current ($I_M$) 322a, as shown in FIG. 3 and supplied through magnetization port 308, produces a voltage across the dielectric material 306 of the charge-to-spin conversion node capacitor resulting in ferroelectric polarization in the dielectric material 306 with a positive charge adjacent the magnetization port 308 and a negative charge adjacent the magnet 304. In contrast, as shown in FIG. 4, a magnet setting current 322b in the opposite direction results in ferroelectric polarization in the dielectric material 306 with the negative charge adjacent the magnetization port 308 and the positive charge adjacent the magnet 304.

As the charge accumulates in the capacitor, the spin of electrons in the dielectric material 306 at the interface between the material 306 and the magnet 304 become aligned to form surface spin polarization, which is effectively a magnet. The direction of magnetization (spin) of the electrons in the surface spin polarization is defined by the direction of ferroelectric polarization within the dielectric material 306. As the magnet corresponding to the surface spin polarization is formed, it becomes exchange coupled with the magnet 304, causing the magnetization in the magnet 304 to align with the magnetic field of the surface spin polarization. In this manner, the direction of magnetization of the magnet 304 may be switched between direction 324a of FIG. 3 and direction 324b of FIG. 4, based on the magnet setting current 322a or 322b respectively.

This setting of the direction of magnetization 324 affects the output of the spin-to-charge conversion node 336 located at the opposite end of the magnet 304. The spin-to-charge conversion node 336 converts spin (e.g., the magnetization 324) to an electric charge current. The spin-to-charge conversion node 336 includes a spin orbit effect stack 330 coupled to the magnet 304, an input port (supply electrode) 302, and a ground electrode 314.

A supply charge current ($I_{in}$) 320 received at the input port (supply electrode) 302 may pass through the supply electrode 302, the magnet 304, the spin orbit effect stack 330, and the ground electrode 314 to ground. As the supply charge current 320 passes through the magnet, the magnetization 324 will produce a spin polarized current in which a substantial majority (e.g., greater than 80%) of electrons associated with the supply charge current 320 will exhibit spin (i.e., magnetization) having a direction corresponding to the magnetization 324 of the magnet. Furthermore, the strength of the spin polarized current (e.g., the proportion of electrons that align with the magnet 304) is proportional to the strength of the magnetization 324. After the supply current passes through the magnet 304 and becomes a spin polarized current, the spin polarized current enters the spin orbit effect stack 330.

The spin orbit effect stack 330 includes a non-magnetic metal material 310 that forms a heterostructure with a spin orbit coupling material 312 that exhibits a spin orbit effect in a metallic system. The non-magnetic material 310 is disposed or deposited on the spin orbit coupling material 312 to define an interface 338. In some examples, the interface 338 defines a high density 2D electron gas that has the ability to produce a strong or high spin orbit effect (also referred to as spin orbit coupling). The spin orbit coupling that occurs at the interface 338 is referred to as the Rashba-Edelstein effect (or Rashba effect for short). Briefly, the Rashba effect results in different electrons associated with the supply charge current 320 being deflected in opposite directions along the 2D electron gas of the interface 338. The direction in which the electrons are deflected depends upon the direction of spin of the electrons. Thus, to the extent that the supply charge current 320 becomes a spin polarized current as it passes through the magnet 304 and enters the spin orbit effect stack 330, a majority of the electrons (with spins aligned with the magnetization 324) will be deflected in one direction with a minority of the electrons being deflected in the opposite direction.

In the illustrated example, the MESO device 300 is configured so that the direction of deflection of the electrons due to the Rashba effect within the spin orbit effect stack 330 is either into or away from the output port 316, which serves as an output for the MESO device 300. More particularly, the deflection of electrons produced by the Rashba effect is along an axis substantially perpendicular to both the supply charge current 320 and the spin polarized current corresponding to the direction of magnetization 324, the two of which are substantially perpendicular to each other. Thus, the output port 316 is positioned substantially perpendicular to the magnet 304 (and associated direction of magnetization 324) and substantially perpendicular to the direction of the supply charge current 320. Thus, the spin orbit effect stack 330 deflects a majority of electrons either into or away from the output port 316, thereby resulting in an output current 332 that is proportional to the supply charge current 320. A residual current 336 will pass through the spin orbit effect stack 330 to ground.

The direction in which electrons are deflected along the axis (e.g., whether into or away from the output port 316) depends upon the relative directions of the electric and spin currents along the other two axes in three-dimensional space. For example, with reference to the axes (X, Y, Z), as shown in FIG. 3, a positive supply charge current 320 (in the positive Z direction) and a negative spin current (corresponding to the magnetization 324a in the negative Y direction) results in a negative output current 332a (in the negative X direction). By contrast, as shown in FIG. 4, a positive supply charge current 320 (in the positive Z direction) and a positive spin current (corresponding to the magnetization 324b in the positive Y direction) results in a positive output current 332b (in the positive X direction). The output current 332 in the illustrated examples is represented as standard current flow, which is opposite electron flow. Thus, the spin orbit effect stack 330 deflects a majority of electrons (with spin aligned with the magnetization 324) into the output port 316 in FIG. 3 (to produce a negative output current 332a) and away from the output port 316 in FIG. 4 (to produce a positive output current 332b).

In the illustrated example, the magnet setting current ($I_M$) 322 and the supply charge current ($I_{in}$) 320 may be provided during separate operations implemented at different times. More particularly, providing the magnet setting current 322 may be compared to a write operation that sets or adjusts the direction of magnetization 324 of the magnet 304. Further, providing the supply charge current 320 may be compared to a read operation that produces the output current 332, which is proportional to the magnetization 324 of the magnet 304 previously established during the write operation associated with the magnet setting current 322.

In some embodiments, the magnetization setting serves as a weighting or scaling function. In some embodiments, the magnetization may be set once and remain fixed during subsequent operation. This example corresponds to a neuron with fixed weights. However, in more complicated examples, which are capable of implementing a learning process in which the weights are updated over time, different magnet setting currents at the magnetization port can cause the magnetization to switch or change.

In some embodiments, the value of the magnetization may be binary in which the magnets 304 are switched between one of two stable states. In such examples, the value of the magnetization is equal in both states but has an opposite sign (e.g., +1 in the first direction and −1 in the second direction). Thus, the corresponding output current 332 is proportional to the input current 320 except that the sign or polarity may be changed. In such cases, the MESO device may be used as a signal repeater (with the magnetization set to +1), or as a signal inverter (with the magnetization set to −1).

In some embodiments, intermediate values for the magnetization may be achieved by controlling the position of a domain wall dividing distinct magnetic domains within the magnets of the MESO devices. Thus, in some examples, the magnetization of the magnets may be controlled to a range of different values. The range may correspond to a plurality of discrete values or it may be substantially continuous between the steady states +1 and −1 described above.

In some embodiments, the spin orbit effect stack 330 includes a non-magnetic metal material 310 such as silver (Ag), aluminum (Al), gold (Au), or copper (Cu) that forms a heterostructure with a spin orbit coupling material 312 that exhibits a spin orbit effect in a metallic system. Example materials for the spin orbit coupling material 312 include elements of group V of the Periodic Table of Elements and their alloys (e.g., bismuth (Bi), bismuth-silver alloys) or traditional interconnect materials (e.g., copper (Cu), gold (Au), silver (Ag), aluminum (Al)) doped with high atomic weight transition elements. In some examples, the spin orbit effect stack 330 may include a spacer formed of a non-magnetic material (e.g., silver or copper) between the magnet 304 and the non-magnetic metal material 310.

In some embodiments, the spin orbit effect stack 330 may be formed of a single material that intrinsically exhibits a spin orbit effect to produce spin orbit coupling within its bulk. Spin orbit coupling occurring intrinsically within a single material is referred to as the bulk effect or the spin Hall effect (SHE). Example materials for such implementations of the spin orbit effect stack 330 include materials with a high SHE coefficient (e.g., on the order of 0.01 to 10 or greater, for example 0.1 to 1) such as tantalum (Ta), tungsten (W), bismuth (Bi), bismuth selenide (Bi2Se3), or platinum (Pt), or high atomic weight transition elements such as lutetium (Lu), hafnium (Hf), rhodium (Rh), osmium (Os), iridium (Ir), gold (Au), or mercury (Hg). The SHE produces the same result as the Rashba effect except that the electrons are deflected within the bulk of the material rather than at the interface 338 of a heterostructure of two materials as shown in FIGS. 3 and 4.

In some embodiments, dielectric 306 may be formed of any suitable magnetoelectric material such as, for example, bismuth ferrite (BiFeO3, BFO), chromium(III) oxide (Cr2O3) or magnesium oxide (MgO).

In some embodiments, electrodes and ports 302, 314, 308, 316 may be formed of copper or any suitable conductive metal.

In some embodiments, magnet 304 may be formed of a ferromagnetic material such as, for example, cobalt (Co), iron (Fe), nickel (Ni), gadolinium (Gd), their alloys, or a Heusler alloy of the form X2YZ or XYZ where X, Y, Z can be elements of cobalt (Co), iron (Fe), nickel (Ni), aluminum (Al), germanium (Ge), gallium (Ga), gadolinium (Gd), manganese (Mn), etc.

Figure 5:
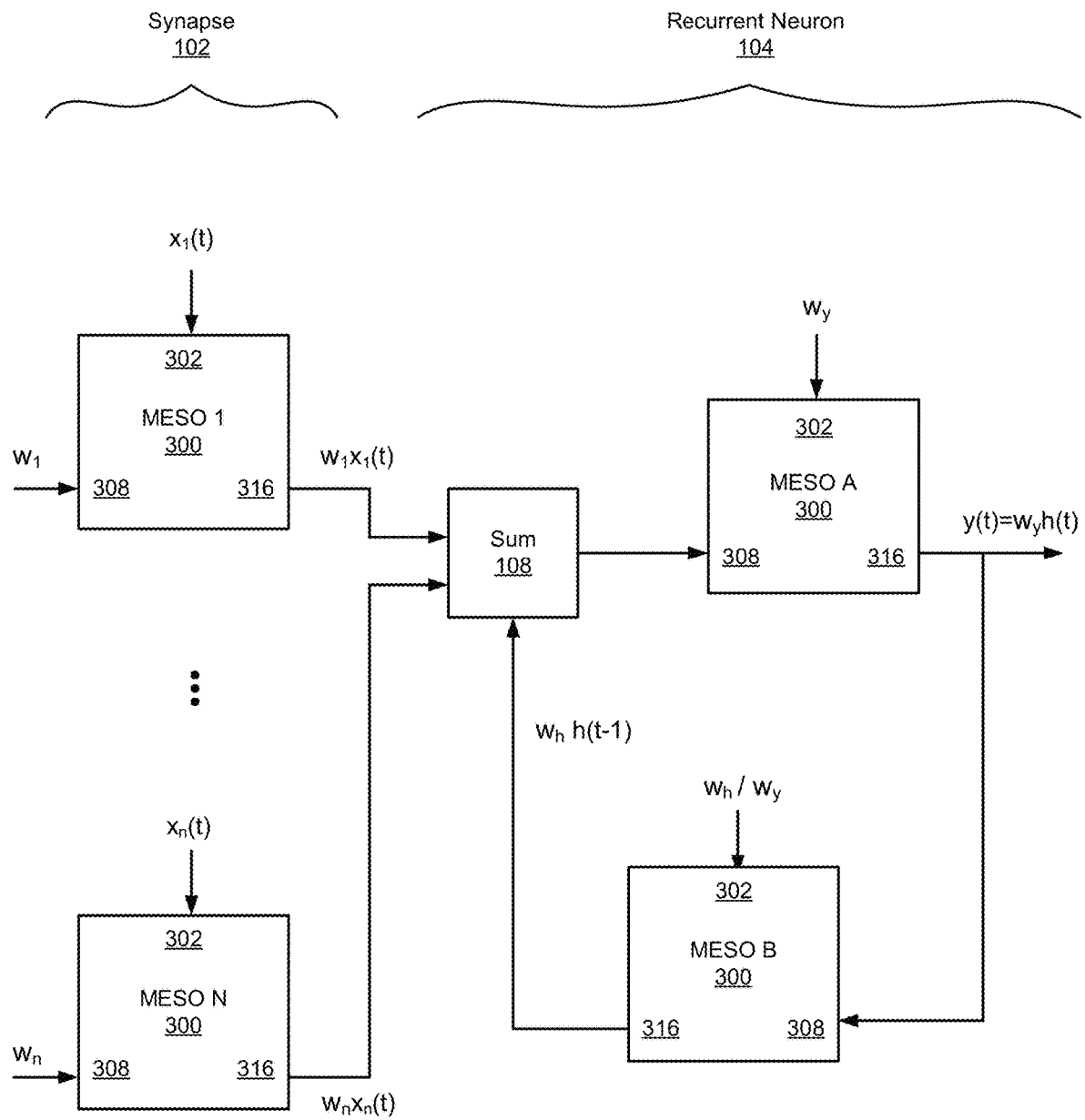
FIG. 5 is a detailed block diagram of a MESO implementation of an RNN node, configured in accordance with certain embodiments of the present disclosure.

FIG. 5 is a detailed block diagram 500 of the MESO implementation 200 of an RNN node, configured in accordance with certain embodiments of the present disclosure. The MESO implementation of the RNN node 200 is shown to include a number of MESO devices 300, specifically MESOs 1-N of the synapse component 102, and MESO A and MESO B of the recurrent neuron component 104.

MESO devices 1-N are configured to perform the multiplication function of circuit 106 to scale the N synaptic input signals $x_i(t)$ by the weighting scale factors $w_i$. The MESO devices perform this multiplication function in the manner described above in connection with the descriptions of FIGS. 3 and 4. The weighting scale factors $w_i$ are applied to the magnetization port 308 of the MESO devices, as the magnet setting current $I_M$ 322. The synaptic input signals $x_i(t)$ are applied to the input port (supply electrode) 302 of the MESO devices, as the supply charge current $I_{in}$ 320. The resulting weighted synaptic inputs $w_i x_i(t)$, generated by the MESO devices, are provided through the output port 316 as the output current $I_{out}$ 332.

The weighted synaptic inputs (along with the weighted previous neuron state) are summed together at current summing junction 108 and then provided as input to MESO device A through the magnetization port 308 of that device.

MESO device A is configured to perform the thresholding function 110 and the output signal weighting by scale factor $w_y$. The output of the summing junction 108 is applied to the magnetization port 308 of MESO A, as the magnet setting current $I_M$ 322. The magnet of MESO A is designed to be induced with a magnetization that is substantially continuously variable across a range of values. Thus, the magnetization of the magnet 304 of MESO A effectively represents a transfer function for the recurrent neuron (e.g., corresponding to the threshold or activation function 110 of FIG. 1) which may be a step function, a tanh function, a sigmoid function, or other suitable threshold function. Said differently, the magnet 304 implements the threshold function as a saturation curve of magneto-electric conversion. The application of this transfer function generates the current state h(t) of the neuron, as previously specified in equation (1).

The weighting scale factor $w_y$ is applied to the input port (supply electrode) 302 of MESO A, as the supply charge current $I_{in}$ 320. The MESO device performs the multiplication of $w_y$ and h(t) to generate the output signal y(t) of the RNN node, which is provided through the output port 316 as the output current $I_{out}$ 332. The multiplication is performed in the same manner as described previously for MESOs 1-N.

MESO device B is configured to perform the memory delay function 112 to generate the previous neuron state, and to perform the feedback scaling $w_h$. The output signal y(t), generated by MESO A, is provided as input to MESO B through the magnetization port 308, as the magnet setting current $I_M$ 322. A weighting scale factor $w_h/w_y$ is applied to the input port (supply electrode) 302 of MESO A, as the supply charge current $I_{in}$ 320. The $1/w_y$ factor is included to cancel out the $w_y$ factor in the y(t) term so that MESO B is operating on h(t) rather than y(t).

The memory delay function 112 is achieved based on the timing of the application of the scale factor to the input port of MESO B relative to the application of y(t) to the magnetization port of MESO B, and relative to the timing of operations of MESO A. Recall that the application of a signal to the MESO input port may be compared to a read operation on the MESO, while the application of a signal to the MESO magnetization port 308 may be compared to a write operation on the MESO, and so the MESO can provide the functionality of a memory unit.

The resulting scaled previous neuron state, $w_h h(t-1)$, is provided through the output port 316 of MESO B as the output current $I_{out}$ 332, to be fed back to the summing junction 108.

Figure 6:
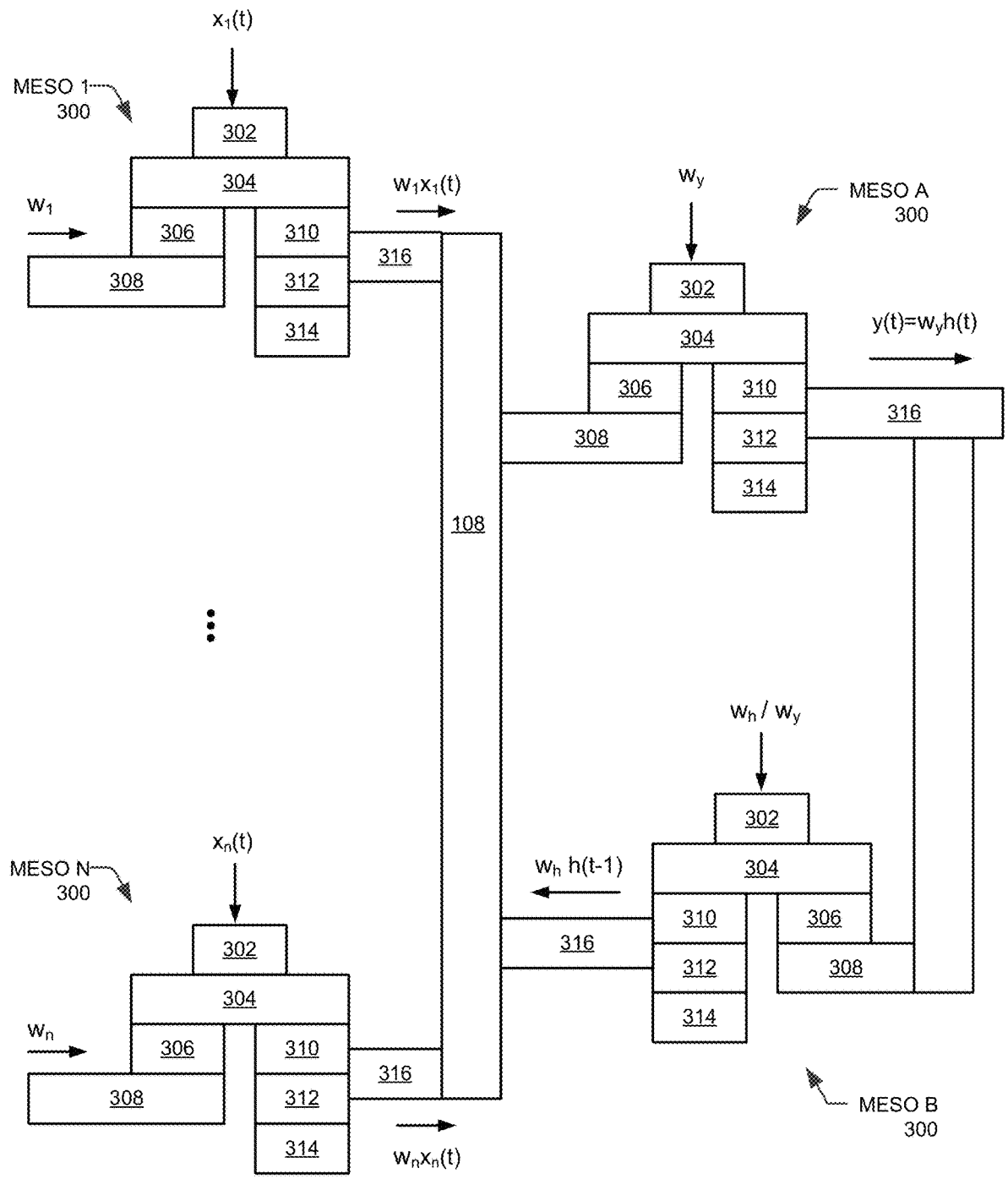
FIG. 6 is another detailed block diagram of a MESO implementation of an RNN node, configured in accordance with certain embodiments of the present disclosure.

FIG. 6 is another detailed block diagram 600 of a MESO implementation 200 of an RNN node, configured in accordance with certain embodiments of the present disclosure. FIG. 6 is similar to FIG. 5 but presents the MESO implementation of the RNN node in the context of a cross-sectional view of the MESO devices. The components of the MESO device, which were illustrated in a three-dimensional view in FIGS. 3 and 4, are shown here in a simplified two-dimensional cross-sectional view.

MESO devices 1-N are configured to perform the multiplication function of circuit 106 to scale the N synaptic input signals $x_i(t)$ by the weighting scale factors $w_i$. The weighting scale factors $w_i$ are applied to the magnetization port 308 of the MESO devices, as the magnet setting current $I_M$ 322. The synaptic input signals $x_i(t)$ are applied to the input port (supply electrode) 302 of the MESO devices, as the supply charge current $I_{in}$ 320. The resulting weighted synaptic inputs $w_i x_i(t)$, generated by the MESO devices, are provided through the output port 316 as the output current $I_{out}$ 332.

The weighted synaptic inputs (along with the weighted previous neuron state) are summed together at current summing junction 108 and then provided as input to MESO device A through the magnetization port 308 of that device.

MESO device A is configured to perform the thresholding function 110 and the output signal weighting by scale factor $w_y$. The output of the summing junction 108 is applied to the magnetization port 308 of MESO A, as the magnet setting current $I_M$ 322. The magnet 304 implements the threshold function as a saturation curve of magneto-electric conversion. The application of this transfer function generates the current state h(t) of the neuron, as previously specified in equation (1).

The weighting scale factor $w_y$ is applied to the input port (supply electrode) 302 of MESO A, as the supply charge current $I_{in}$ 320. The MESO device performs the multiplication of $w_y$ and h(t) to generate the output signal y(t) of the RNN node, which is provided through the output port 316 as the output current $I_{out}$ 332.

MESO device B is configured to perform the memory delay function 112 to generate the previous neuron state, and to perform the feedback scaling $w_h$. The output signal y(t), generated by MESO A, is provided as input to MESO B through the magnetization port 308, as the magnet setting current $I_M$ 322. A weighting scale factor $w_h/w_y$ is applied to the input port (supply electrode) 302 of MESO A, as the supply charge current $I_{in}$ 320.

The resulting scaled previous neuron state, $w_h h(t-1)$, is provided through the output port 316 of MESO B as the output current $I_{out}$ 332, to be fed back to the summing junction 108.

As shown in the illustrated example of FIGS. 5 and 6, the value of the summation of the output charge currents provided by each MESO devices 1-N and MESO device B is communicated from those devices to MESO device A as an electric current. As a result, the length of the conductive channel 108 and, thus, the number of input MESO devices 1-N that may be included in the RNN node is effectively unlimited within practical constraints. This provides significant improvements over other artificial neuron embodiments that rely on spin polarized currents to communicate weighted inputs to an output device, because spin polarized currents are limited to relatively short distances (e.g., less than 1 micrometer) due to signal attenuation. While the MESO devices described herein produce spin polarized currents that are used to implement the RNN node, the usage of the spin polarized current is locally limited to each specific MESO device (within the spin-to-charge conversion node 336 described in FIGS. 3 and 4). As a result, in accordance with embodiments of the present disclosure, the design of large neurons with many input MESO devices (and/or inputs spaced far apart from each other and/or an output MESO device) becomes feasible.

Figure 7A:
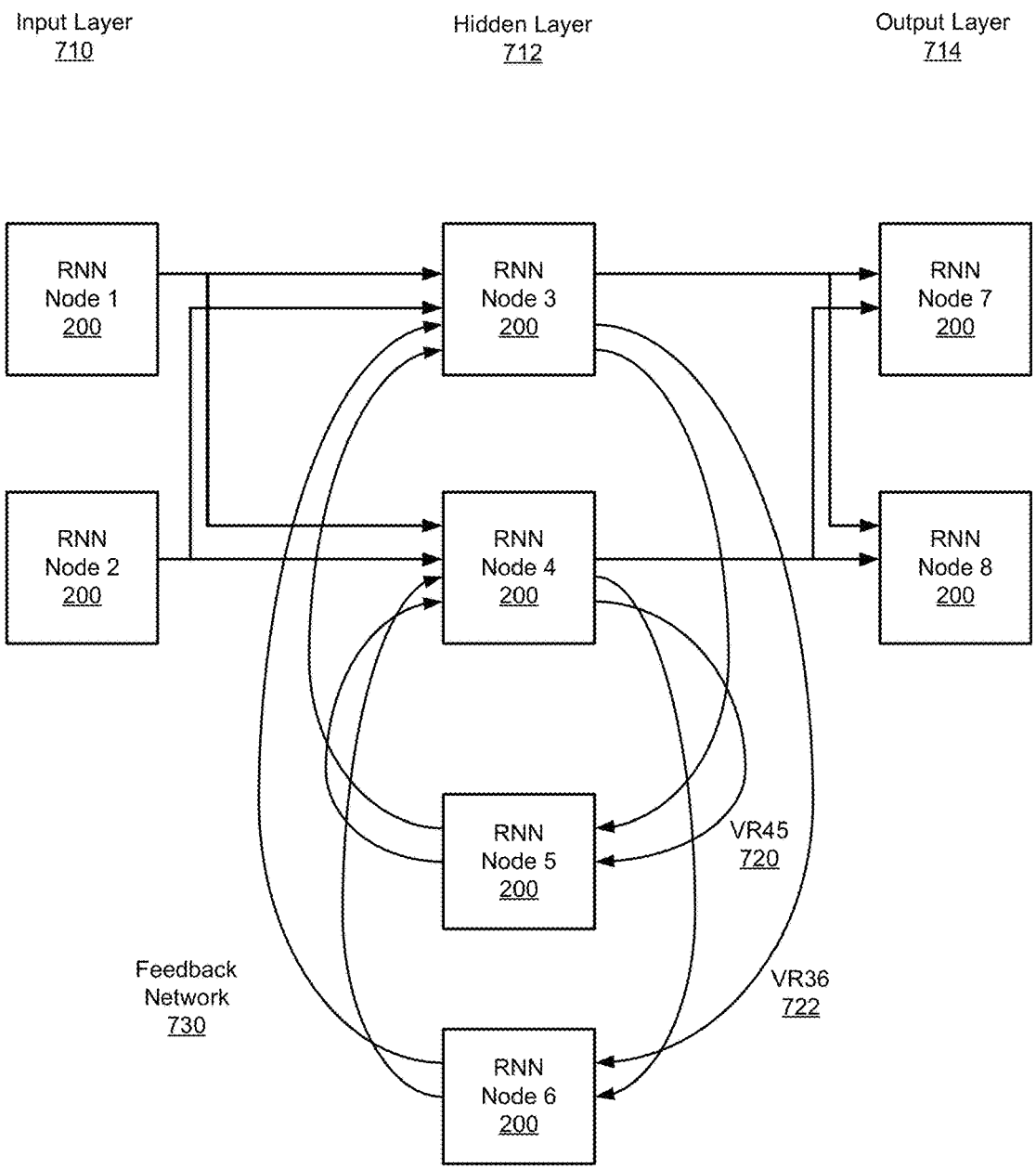
FIG. 7A is a block diagram of a MESO based RNN, configured in accordance with certain embodiments of the present disclosure.

FIG. 7A is a block diagram of a MESO based recurrent neural network (RNN) 700a, configured in accordance with certain embodiments of the present disclosure. An RNN is shown to comprise a number of MESO based RNN nodes 200, distributed among the three layers: an input layer 710, a hidden layer 712, and an output layer 714. This RNN 700a is a simplified example for illustration purposes. In practice, an RNN would typically comprise many more layers, each having many more nodes. Although each node 200 has a recurrent neuron 104 with an internal feedback mechanism, as previously described, the overall neural network 700a may comprise additional feedback paths, as shown for example through RNN nodes 5 and 6, and these feedback paths may have variable weights (e.g., recurrence coefficients) 720, 722. These feedback paths comprise a feedback network 730. In some embodiments the variable weights may be variable resistors VR45, VR46 which can be implemented as transistors, oxide resistive random access memory (RRAM), phase change memory, metal-insulator transition devices, or magnetic tunnel junctions.

Figure 7B:
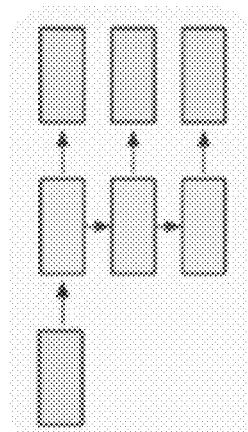
FIG. 7B is another block diagram of MESO based RNN configurations, in accordance with certain embodiments of the present disclosure.
Figure 7B:
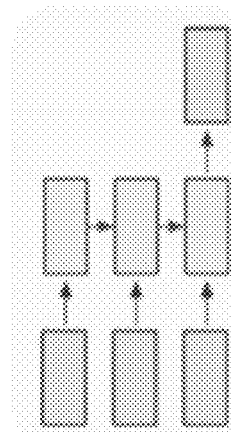
Figure 7B:
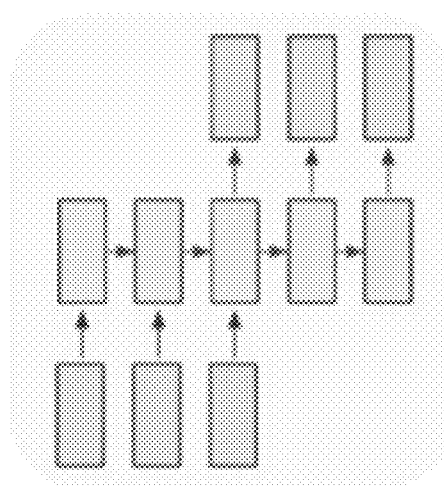
Figure 7B:
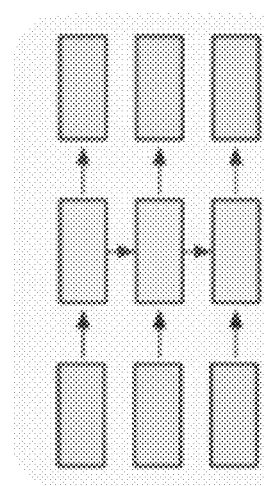

FIG. 7B is another block diagram of MESO based RNN configurations 700b, in accordance with certain embodiments of the present disclosure. As shown, RNN nodes 200 may be interconnected in various configurations including one-to-one 750, one-to-many 752, many-to-one 754, and many-to-many 756, 758. In each case, only three layers of the RNN are shown, for simplicity. In some embodiments, the one-to-many configuration 752 may be employed for image captioning applications, the many-to-one configuration 754 may be employed for sentiment classification, the many-to-many configuration 756 may be employed for translation applications, and the many-to-many configuration 758 may be employed for video captioning applications.

Methodology

Figure 8:
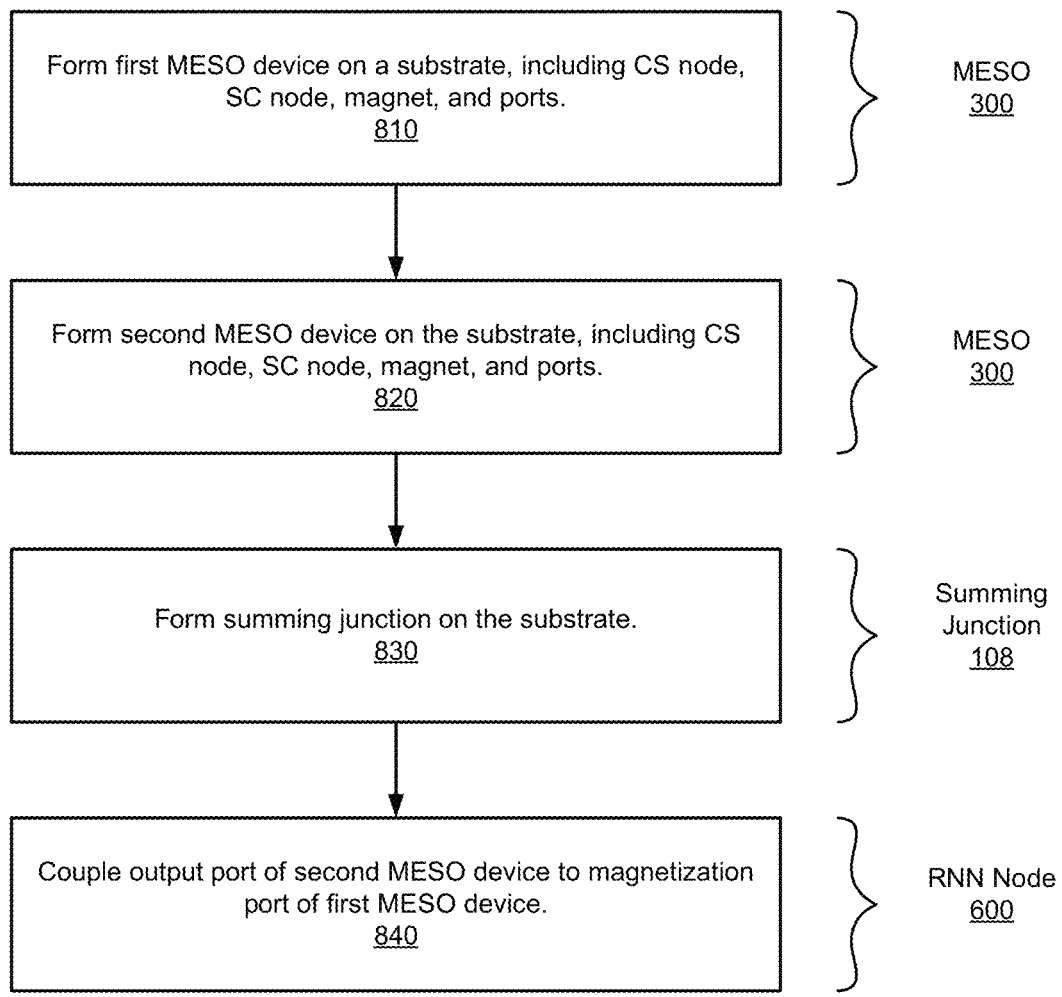
FIG. 8 is a flowchart illustrating a methodology for forming a recurrent neuron, in accordance with certain embodiments of the present disclosure.

FIG. 8 is a flowchart illustrating an example method 800 for forming a recurrent neuron on an integrated circuit (IC), in accordance with certain embodiments of the present disclosure. As can be seen, the example method includes a number of phases and sub-processes, the sequence of which may vary from one embodiment to another. However, when considered in the aggregate, these phases and sub-processes form a process for forming a recurrent neuron, in accordance with certain of the embodiments disclosed herein. These embodiments can be implemented, for example, using the system architecture illustrated in FIGS. 1-7, as described above. However other system architectures can be used in other embodiments, as will be apparent in light of this disclosure. To this end, the correlation of the various functions shown in FIG. 8 to the specific components illustrated in the other figures is not intended to imply any structural and/or use limitations. Rather, other embodiments may include, for example, varying degrees of integration wherein multiple functionalities are effectively performed by one system. Thus, other embodiments may have fewer or more modules and/or sub-modules depending on the granularity of implementation. Numerous variations and alternative configurations will be apparent in light of this disclosure.

As illustrated in FIG. 8, in an embodiment, method 800 for forming a recurrent neuron on an IC commences at operation 810, by forming a first magneto-electric spin orbit (MESO) device on a substrate. The MESO device comprises a charge-to-spin conversion node (CS node), a spin-to-charge conversion node (SC node), a magnet coupling the CS node to the SC node, a magnetization port coupled to the CS node, an input port coupled to a supply electrode of the SC node, and an output port coupled to a spin orbit effect stack of the SC node.

The first MESO device is configured to apply a threshold function to a recurrent neuron input signal supplied through the magnetization port of the first MESO device, and to scale the thresholded recurrent neuron input signal by a first weighting factor supplied through the input port of the first MESO device to generate a recurrent neuron output signal at the output port of the first MESO device.

Next, at operation 820, a second MESO device is formed on the substrate. The magnetization port of the second MESO device is coupled to the output port of the first MESO device. The second MESO device is configured to receive the recurrent neuron output signal at the magnetization port of the second MESO device and to generate a scaled previous state value of the recurrent neuron at the output port of the second MESO device. The scaled previous state value is a scaled and time delayed version of the recurrent neuron output signal. The scaling is based on a second weighting factor supplied through the input port of the second MESO device.

At operation 830, a summing junction is formed on the substrate. At operation 840, the summing junction is coupled to the output port of the second MESO device and to the magnetization port of the first MESO device. The summing junction is configured to sum the scaled previous state value of the recurrent neuron with one or more weighted synaptic input signals provided to the recurrent neuron.

Of course, in some embodiments, additional operations may be performed, as previously described in connection with the system. For example, one or more additional MESO devices may be formed on the substrate, to generate the weighted synaptic input signal. In some embodiments, the additional MESO devices are configured to apply weighting factors to synaptic input signals. The weighting factors are supplied through the magnetization ports of the MESO devices, and the synaptic input signals are supplied through the input ports of the MESO devices.

EXAMPLE SYSTEM

Figure 9:
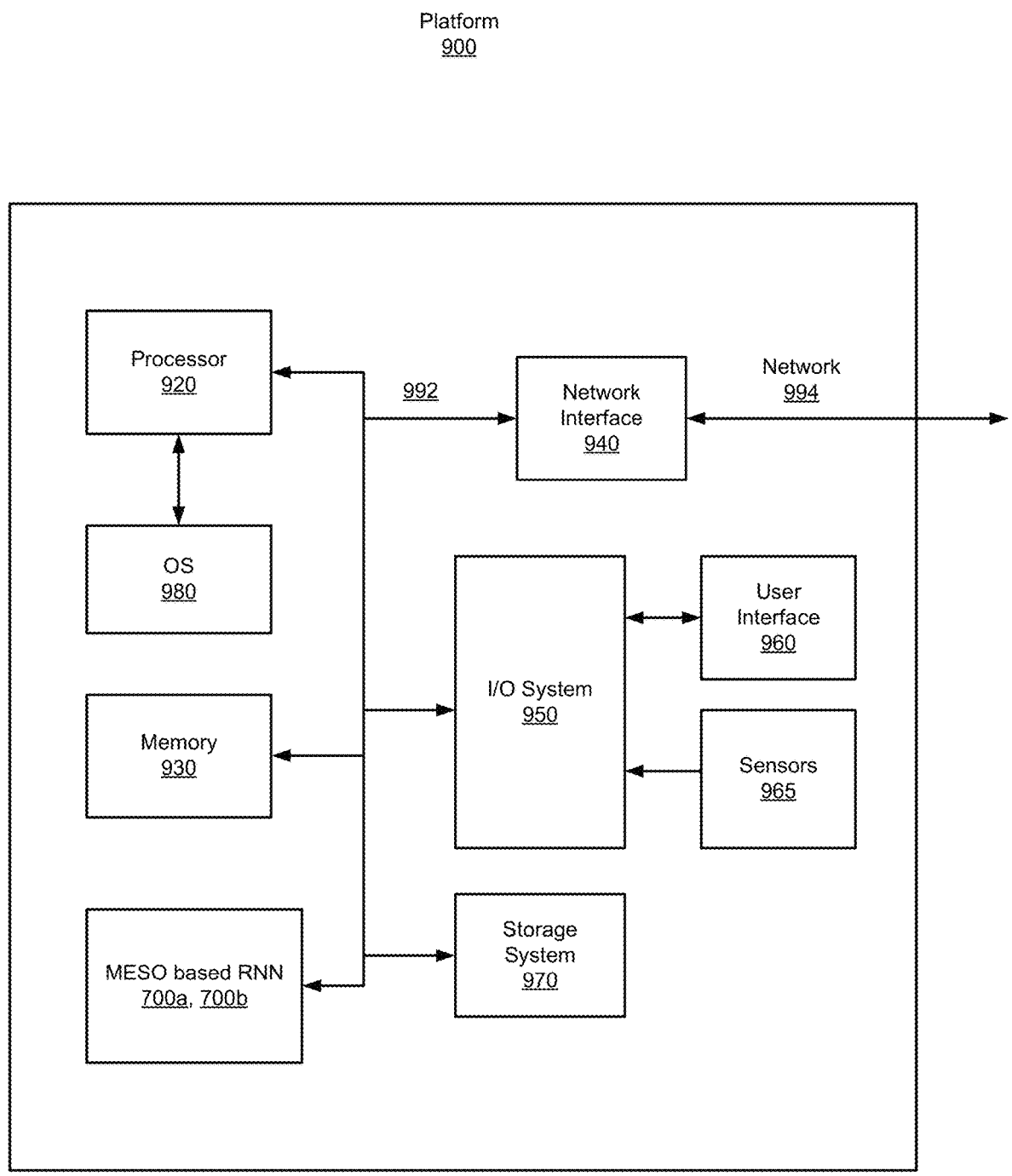
FIG. 9 is a block diagram schematically illustrating a device platform configured to employ MESO based RNN, in accordance with certain embodiments of the present disclosure.

FIG. 9 illustrates an example device platform 900, configured in accordance with certain embodiments of the present disclosure, to employ a MESO based RNN. In some embodiments, platform 900 may be hosted on, or otherwise be incorporated into a personal computer, workstation, server system, laptop computer, ultra-laptop computer, tablet, touchpad, portable computer, handheld computer, palmtop computer, personal digital assistant (PDA), cellular telephone, combination cellular telephone and PDA, smart device (for example, smartphone or smart tablet), mobile internet device (MID), messaging device, data communication device, wearable device, smart home management system, robotic system, embedded system, and so forth. Any combination of different devices may be used in certain embodiments.

In some embodiments, platform 900 may comprise any combination of a processor 920, a memory 930, MESO based RNNs 700a, 700b (comprising any number of RNN nodes 200), a network interface 940, an input/output (I/O) system 950, a user interface 960, sensors 965, and a storage system 970. As can be further seen, a bus and/or interconnect 992 is also provided to allow for communication between the various components listed above and/or other components not shown. Platform 900 can be coupled to a network 994 through network interface 940 to allow for communications with other computing devices, platforms, devices to be controlled, or other resources. Other componentry and functionality not reflected in the block diagram of FIG. 9 will be apparent in light of this disclosure, and it will be appreciated that other embodiments are not limited to any particular hardware configuration.

Processor 920 can be any suitable processor, and may include one or more coprocessors or controllers, such as an audio processor, a graphics processing unit, or hardware accelerator, to assist in control and processing operations associated with platform 900. In some embodiments, the processor 920 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 920 may be implemented as a complex instruction set computer (CISC) or a reduced instruction set computer (RISC) processor. In some embodiments, processor 920 may be configured as an x86 instruction set compatible processor.

Memory 930 can be implemented using any suitable type of digital storage including, for example, flash memory and/or random-access memory (RAM). In some embodiments, the memory 930 may include various layers of memory hierarchy and/or memory caches as are known to those of skill in the art. Memory 930 may be implemented as a volatile memory device such as, but not limited to, a RAM, dynamic RAM (DRAM), or static RAM (SRAM) device. Storage system 970 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 970 may comprise technology to increase the storage performance enhanced protection for valuable digital media when multiple hard drives are included.

Processor 920 may be configured to execute an Operating System (OS) 980 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 900, and therefore may also be implemented using any suitable existing or subsequently-developed platform.

Network interface circuit 940 can be any appropriate network chip or chipset which allows for wired and/or wireless connection between other components of device platform 900 and/or network 994, thereby enabling platform 900 to communicate with other local and/or remote computing systems, servers, cloud-based servers, and/or other resources. Wired communication may conform to existing (or yet to be developed) standards, such as, for example, Ethernet. Wireless communication may conform to existing (or yet to be developed) standards, such as, for example, cellular communications including LTE (Long Term Evolution), Wireless Fidelity (Wi-Fi), Bluetooth, and/or Near Field Communication (NFC). Exemplary wireless networks include, but are not limited to, wireless local area networks, wireless personal area networks, wireless metropolitan area networks, cellular networks, and satellite networks.

I/O system 950 may be configured to interface between various I/O devices and other components of device platform 900. I/O devices may include, but not be limited to, user interface 960 and sensors 965. User interface 960 may include devices (not shown) such as a speaker, microphone, display element, touchpad, keyboard, and mouse, etc. Sensors 965 may include any type of data acquisition circuits or mechanisms configured to provide data, for example to be processed by the MESO based RNNs 700a, 700b. I/O system 950 may include a graphics subsystem configured to perform processing of images for rendering on the display element. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 920 or any chipset of platform 900.

It will be appreciated that in some embodiments, the various components of platform 900 may be combined or integrated in a system-on-a-chip (SoC) architecture. In some embodiments, the components may be hardware components, firmware components, software components or any suitable combination of hardware, firmware or software.

MESO based RNNs 700a and 700b are configured to employ any number of RNN nodes 200, as described previously and illustrated in FIGS. 7A and 7B. The RNN nodes 200 may include any or all of the circuits/components illustrated in FIGS. 1-6, as described above. In some embodiments, the MESO based RNN may be employed to perform image/video captioning, sentiment classification, natural language processing, and translation tasks, to name a few.

In various embodiments, platform 900 may be implemented as a wireless system, a wired system, or a combination of both. When implemented as a wireless system, platform 900 may include components and interfaces suitable for communicating over a wireless shared media, such as one or more antennae, transmitters, receivers, transceivers, amplifiers, filters, control logic, and so forth. An example of wireless shared media may include portions of a wireless spectrum, such as the radio frequency spectrum and so forth. When implemented as a wired system, platform 900 may include components and interfaces suitable for communicating over wired communications media, such as input/output adapters, physical connectors to connect the input/output adaptor with a corresponding wired communications medium, a network interface card (NIC), disc controller, video controller, audio controller, and so forth. Examples of wired communications media may include a wire, cable metal leads, printed circuit board (PCB), backplane, switch fabric, semiconductor material, twisted pair wire, coaxial cable, fiber optics, and so forth.

Various embodiments may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. The instructions can be encoded using a suitable programming language, such as C, C++, object oriented C, Java, JavaScript, Visual Basic .NET, Beginner's All-Purpose Symbolic Instruction Code (BASIC), or alternatively, using custom or proprietary instruction sets. The instructions can be provided in the form of one or more computer software applications and/or applets that are tangibly embodied on a memory device, and that can be executed by a computer having any suitable architecture. In one embodiment, the system can be hosted on a given website and implemented, for example, using JavaScript or another suitable browser-based technology. For instance, in certain embodiments, the system may leverage processing resources provided by a remote computer system accessible via network 994. In other embodiments, the functionalities disclosed herein can be incorporated into other applications, such as, for example, video processing applications, audio processing applications, language applications, entertainment applications, and robotic applications. The applications disclosed herein may include any number of different modules, submodules, or other components of distinct functionality, and can provide information to, or receive information from, still other components. These modules can be used, for example, to communicate with input and/or output devices such as a display screen, a touch sensitive surface, a printer, and/or any other suitable device. Other componentry and functionality not reflected in the illustrations will be apparent in light of this disclosure, and it will be appreciated that other embodiments are not limited to any particular hardware or software configuration. Thus, in other embodiments platform 900 may comprise additional, fewer, or alternative subcomponents as compared to those included in the example embodiment of FIG. 9.

The aforementioned non-transitory computer readable medium may be any suitable medium for storing digital information, such as a hard drive, a server, a flash memory, and/or random-access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical entities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, etc. configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads, etc., in a hierarchical fashion. Firmware may be embodied as code, instructions or instruction sets and/or data that are hardcoded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, etc. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

FURTHER EXAMPLE EMBODIMENTS

The following examples pertain to further embodiments, from which numerous permutations and configurations will be apparent.

Example 1 is a recurrent neuron comprising: a first magneto-electric spin orbit (MESO) device to apply a threshold function to an input signal supplied through a magnetization port of the first MESO device, and to scale the thresholded input signal by a first weighting factor supplied through an input port of the first MESO device to generate an output signal at an output port of the first MESO device; and a second MESO device to receive the output signal at a magnetization port of the second MESO device and to generate a scaled previous state value at an output port of the second MESO device, wherein the scaled previous state value is a scaled and time delayed version of the output signal, the scaling based on a second weighting factor supplied through an input port of the second MESO device; wherein the input signal is a summation of the scaled previous state value with one or more weighted synaptic input signals provided to the magnetization port of the first MESO device.

Example 2 includes the subject matter of Example 1, wherein the first and second MESO devices comprise a charge-to-spin conversion node (CS node), a spin-to-charge conversion node (SC node), and a magnet coupling the CS node to the SC node, the magnetization port coupled to the CS node, the input port coupled to a supply electrode of the SC node, and the output port coupled to a spin orbit effect stack of the SC node.

Example 3 includes the subject matter of Examples 1 or 2, wherein the CS node is to control a magnetization of the magnet based on a magnet setting current supplied to the magnetization port, and the magnet comprises a ferromagnetic material configured to retain the magnetization in a nonvolatile state.

Example 4 includes the subject matter of any of Examples 1-3, wherein the SC node is to generate an output current at the spin orbit effect stack, delivered through the output port, based on the magnetization of the magnet and based on an input current applied to the supply electrode of the input port.

Example 5 includes the subject matter of any of Examples 1-4, wherein the threshold function is a hyperbolic tangent function associated with a saturation curve of conversion from current to magnetization.

Example 6 includes the subject matter of any of Examples 1-5, wherein the time delay of the scaled previous state value is based on a timing of application of the second weighting factor supplied through the input port of the second MESO device relative to a timing of application of the output signal at the magnetization port of the second MESO device.

Example 7 includes the subject matter of any of Examples 1-6, wherein the weighted synaptic input signal is generated by a third MESO device configured to apply a third weighting factor to a synaptic input signal, the third weighting factor supplied through a magnetization port of the third MESO device, and the synaptic input signal supplied through an input port of the third MESO device.

Example 8 is an integrated circuit recurrent neural network (RNN) comprising two or more of the recurrent neurons of any of Examples 1-7.

Example 9 includes the subject matter of any of Examples 1-8, further comprising a variable resistor to couple an output port of a first of the recurrent neurons to a synaptic input port associated with a second of the recurrent neurons.

Example 10 is a processor comprising the integrated circuit RNN of Example 8.

Example 11 is a method of forming a recurrent neuron, the method comprising: forming a first magneto-electric spin orbit (MESO) device on a substrate, the MESO device comprising a charge-to-spin conversion node (CS node), a spin-to-charge conversion node (SC node), a magnet coupling the CS node to the SC node, a magnetization port coupled to the CS node, an input port coupled to a supply electrode of the SC node, and an output port coupled to a spin orbit effect stack of the SC node; forming a second MESO device on the substrate, the magnetization port of the second MESO device coupled to the output port of the first MESO device; and forming a summing junction on the substrate, the summing junction coupled to the output port of the second MESO device and to the magnetization port of the first MESO device.

Example 12 includes the subject matter of Example 11, wherein the first MESO device is to apply a threshold function to an input signal supplied through the magnetization port of the first MESO device, and to scale the thresholded input signal by a first weighting factor supplied through the input port of the first MESO device to generate an output signal at the output port of the first MESO device.

Example 13 includes the subject matter of Examples 11 or 12, wherein the second MESO device is to receive the output signal at the magnetization port of the second MESO device and to generate a scaled previous state value at the output port of the second MESO device, wherein the scaled previous state value is a scaled and time delayed version of the output signal, the scaling based on a second weighting factor supplied through the input port of the second MESO device.

Example 14 includes the subject matter of any of Examples 11-13, wherein the summing junction is to sum the scaled previous state value with one or more weighted synaptic input signals provided to the magnetization port of the first MESO device.

Example 15 includes the subject matter of any of Examples 11-14, further comprising forming a third MESO device on the substrate, to generate the weighted synaptic input signal.

Example 16 includes the subject matter of any of Examples 11-15, wherein the third MESO device is to apply a third weighting factor to a synaptic input signal, the third weighting factor supplied through the magnetization port of the third MESO device, and the synaptic input signal supplied through the input port of the third MESO device.

Example 17 includes the subject matter of any of Examples 11-16, wherein the CS node is to control a magnetization of the magnet based on a magnet setting current supplied to the magnetization port, and the magnet comprises a ferromagnetic material configured to retain the magnetization in a nonvolatile state.

Example 18 includes the subject matter of any of Examples 11-17, wherein the SC node is to generate an output current at the spin orbit effect stack, delivered through the output port, based on the magnetization of the magnet and based on an input current applied to the supply electrode of the input port.

Example 19 includes the subject matter of any of Examples 11-18, wherein the substrate is a semiconductor substrate.

Example 20 includes the subject matter of any of Examples 11-19, wherein the substrate is a semiconductor wafer.

Example 21 includes the subject matter of any of Examples 11-20, wherein the substrate is a printed circuit board.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:

1. A recurrent neuron comprising:
a first magneto-electric spin orbit (MESO) device to apply a threshold function to an input signal supplied through a magnetization port of the first MESO device, and to scale the thresholded input signal by a first weighting factor supplied through an input port of the first MESO device to generate an output signal at an output port of the first MESO device; and
a second MESO device to receive the output signal at a magnetization port of the second MESO device and to generate a scaled previous state value at an output port of the second MESO device, wherein the scaled previous state value is a scaled and time delayed version of the output signal, the scaling based on a second weighting factor supplied through an input port of the second MESO device;
wherein the input signal is a summation of the scaled previous state value with one or more weighted synaptic input signals provided to the magnetization port of the first MESO device, wherein the first and second MESO devices comprise a charge-to-spin conversion node (CS node), a spin-to-charge conversion node (SC node), and a magnet coupling the CS node to the SC node, the magnetization port coupled to the CS node, the input port coupled to a supply electrode of the SC node, and the output port coupled to a spin orbit effect stack of the SC node.

2. The recurrent neuron of claim 1, wherein the CS node is to control a magnetization of the magnet based on a magnet setting current supplied to the magnetization port, and the magnet comprises a ferromagnetic material configured to retain the magnetization in a nonvolatile state.

3. The recurrent neuron of claim 2, wherein the SC node is to generate an output current at the spin orbit effect stack, delivered through the output port, based on the magnetization of the magnet and based on an input current applied to the supply electrode of the input port.

4. The recurrent neuron of claim 1, wherein the threshold function is a hyperbolic tangent function associated with a saturation curve of conversion from current to magnetization.

5. The recurrent neuron of claim 1, wherein the time delay of the scaled previous state value is based on a timing of application of the second weighting factor supplied through the input port of the second MESO device relative to a timing of application of the output signal at the magnetization port of the second MESO device.

6. The recurrent neuron of claim 1, wherein the weighted synaptic input signal is generated by a third MESO device configured to apply a third weighting factor to a synaptic input signal, the third weighting factor supplied through a magnetization port of the third MESO device, and the synaptic input signal supplied through an input port of the third MESO device.

7. An integrated circuit recurrent neural network (RNN) comprising two or more of the recurrent neurons of claim 1.

8. The integrated circuit RNN of claim 7, further comprising a variable resistor to couple an output port of a first of the recurrent neurons to a synaptic input port associated with a second of the recurrent neurons.

9. A processor comprising the integrated circuit RNN of claim 7.

10. A method of forming a recurrent neuron, the method comprising:
forming a first magneto-electric spin orbit (MESO) device on a substrate, the MESO device comprising a charge-to-spin conversion node (CS node), a spin-to-charge conversion node (SC node), a magnet coupling the CS node to the SC node, a magnetization port coupled to the CS node, an input port coupled to a supply electrode of the SC node, and an output port coupled to a spin orbit effect stack of the SC node;

forming a second MESO device on the substrate, the magnetization port of the second MESO device coupled to the output port of the first MESO device; and forming a summing junction on the substrate, the summing junction coupled to the output port of the second MESO device and to the magnetization port of the first MESO device.

11. The method of claim 10, wherein the first MESO device is to apply a threshold function to an input signal supplied through the magnetization port of the first MESO device, and to scale the thresholded input signal by a first weighting factor supplied through the input port of the first MESO device to generate an output signal at the output port of the first MESO device.

12. The method of claim 11, wherein the second MESO device is to receive the output signal at the magnetization port of the second MESO device and to generate a scaled previous state value at the output port of the second MESO device, wherein the scaled previous state value is a scaled and time delayed version of the output signal, the scaling based on a second weighting factor supplied through the input port of the second MESO device.

13. The method of claim 12, wherein the summing junction is to sum the scaled previous state value with one or more weighted synaptic input signals provided to the magnetization port of the first MESO device.

14. The method of claim 13, further comprising forming a third MESO device on the substrate, to generate the weighted synaptic input signal.

15. The method of claim 14, wherein the third MESO device is to apply a third weighting factor to a synaptic input signal, the third weighting factor supplied through the magnetization port of the third MESO device, and the synaptic input signal supplied through the input port of the third MESO device.

16. The method of claim 10, wherein the CS node is to control a magnetization of the magnet based on a magnet setting current supplied to the magnetization port, and the magnet comprises a ferromagnetic material configured to retain the magnetization in a nonvolatile state.

17. The method of claim 16, wherein the SC node is to generate an output current at the spin orbit effect stack, delivered through the output port, based on the magnetization of the magnet and based on an input current applied to the supply electrode of the input port.

18. The method of claim 10, wherein the substrate is a semiconductor substrate.

19. The method of claim 10, wherein the substrate is a semiconductor wafer.

20. The method of claim 10, wherein the substrate is a printed circuit board.

21. A recurrent neuron comprising:
a first magneto-electric spin orbit (MESO) device to apply a threshold function to an input signal supplied through a magnetization port of the first MESO device, and to scale the thresholded input signal by a first weighting factor supplied through an input port of the first MESO device to generate an output signal at an output port of the first MESO device; and a second MESO device to receive the output signal at a magnetization port of the second MESO device and to generate a scaled previous state value at an output port of the second MESO device, wherein the scaled previous state value is a scaled and time delayed version of the output signal, the scaling based on a second weighting factor supplied through an input port of the second MESO device;

wherein the input signal is a summation of the scaled previous state value with one or more weighted synaptic input signals provided to the magnetization port of the first MESO device, wherein the weighted synaptic input signal is generated by a third MESO device configured to apply a third weighting factor to a synaptic input signal, the third weighting factor supplied through a magnetization port of the third MESO device, and the synaptic input signal supplied through an input port of the third MESO device.

22. An integrated circuit recurrent neural network (RNN) comprising two or more of the recurrent neurons, each of the two or more of the recurrent neurons comprising:
a first magneto-electric spin orbit (MESO) device to apply a threshold function to an input signal supplied through a magnetization port of the first MESO device, and to scale the thresholded input signal by a first weighting factor supplied through an input port of the first MESO device to generate an output signal at an output port of the first MESO device; and a second MESO device to receive the output signal at a magnetization port of the second MESO device and to generate a scaled previous state value at an output port of the second MESO device, wherein the scaled previous state value is a scaled and time delayed version of the output signal, the scaling based on a second weighting factor supplied through an input port of the second MESO device;

wherein the input signal is a summation of the scaled previous state value with one or more weighted synaptic input signals provided to the magnetization port of the first MESO device.

23. The integrated circuit RNN of claim 22, further comprising a variable resistor to couple an output port of a first of the recurrent neurons to a synaptic input port associated with a second of the recurrent neurons.

24. A processor comprising the integrated circuit RNN of claim 22.

* * * * *